(12) United States Patent
Lin

(10) Patent No.: US 7,016,095 B2
(45) Date of Patent: Mar. 21, 2006

(54) METHOD FOR FABRICATING AN INTERFERENCE DISPLAY UNIT

(75) Inventor: Wen-Jian Lin, Hsinchu (TW)

(73) Assignee: Prime View International Co., Ltd., (TW)

( * ) Notice: Subject to any disclaimer, the term of this patent is extended or adjusted under 35 U.S.C. 154(b) by 0 days.

(21) Appl. No.: 11/069,938

(22) Filed: Mar. 3, 2005

(65) Prior Publication Data

US 2005/0168849 A1    Aug. 4, 2005

Related U.S. Application Data

(62) Division of application No. 10/706,923, filed on Nov. 14, 2003.

(30) Foreign Application Priority Data

Apr. 21, 2003   (TW) .............................. 92109263 A

(51) Int. Cl.
*G02F 1/03*   (2006.01)
*G02F 1/07*   (2006.01)
(52) U.S. Cl. ...................... 359/254; 359/242; 359/315
(58) Field of Classification Search ................ 359/254
See application file for complete search history.

(56) References Cited

U.S. PATENT DOCUMENTS

| 5,835,255 | A |   | 11/1998 | Miles ........................... 359/291 |
| 5,959,763 | A | * | 9/1999 | Bozler et al. ................ 359/290 |
| 6,327,071 | B1 | * | 12/2001 | Kimura ....................... 359/291 |
| 6,642,913 | B1 | * | 11/2003 | Kimura et al. ................ 345/84 |
| 6,650,455 | B1 | * | 11/2003 | Miles .......................... 359/237 |
| 2004/0209195 | A1 | * | 10/2004 | Lin .............................. 430/315 |

* cited by examiner

Primary Examiner—Jordan M. Schwartz
Assistant Examiner—Jessica Stultz

(57) ABSTRACT

An interference display unit with a first electrode, a second electrode and posts located between the two electrodes is provided. The characteristic of the interference display unit is that the second electrode's stress is released through a thermal process. The position of the second electrode is shifted and the distance between the first electrode and the second electrode is therefore defined. A method for fabricating the structure described as follow. A first electrode and a sacrificial layer are sequentially formed on a substrate and at least two openings are formed in the first electrode and the sacrificial layer. A supporter is formed in the opening and the supporter may have at least one arm on the top portion of the supporter. A second electrode is formed on the sacrificial layer and the supporter and a thermal process is performed. Finally, The sacrificial layer is removed.

11 Claims, 5 Drawing Sheets

METHOD FOR FABRICATING AN INTERFERENCE DISPLAY UNIT

This application is a divisional of U.S. patent application Ser. No. 10/706,923 filed Nov. 14, 2003.

FIELD OF INVENTION

The present invention relates to a method for manufacturing an optical interference display. More particularly, the present invention relates to a method for manufacturing an optical interference display with posts of arms.

BACKGROUND OF THE INVENTION

Planar displays are popular for portable displays and displays with space limits because they are light and small in size. To date, planar displays in addition to liquid crystal displays (LCD), organic electro-luminescent displays (OLED), plasma display panels (PDP) and so on, as well as a mode of the optical interference display are of interest.

U.S. Pat. No. 5,835,255 discloses an array of display units of visible light that can be used in a planar display. Please refer to FIG. 1, which depicts a cross-sectional view of a display unit in the prior art. Every optical interference display unit 100 comprises two walls, 102 and 104. Posts 106 support these two walls 102 and 104, and a cavity 108 is subsequently formed. The distance between these two walls 102 and 104, that is, the length of the cavity 108, is D. One of the walls 102 and 104 is a hemi-transmissible/hemi-reflective layer with an absorption rate that partially absorbs visible light, and the other is a light reflective layer that is deformable when voltage is applied. When the incident light passes through the wall 102 or 104 and arrives in the cavity 108, in all visible light spectra, only the visible light with the wavelength corresponding to the formula 1.1 can generate a constructive interference and can be emitted, that is, $$2D = N\lambda \tag{1.1}$$

where N is a natural number.

When the length D of cavity 108 is equal to half of the wavelength times any natural number, a constructive interference is generated and a sharp light wave is emitted. In the meantime, if the observer follows the direction of the incident light, a reflected light with wavelength $\lambda_1$ can be observed. Therefore, the display unit 100 is "open".

The first wall 102 is a hemi-transmissible/hemi-reflective electrode that comprises a substrate, an absorption layer, and a dielectric layer. Incident light passing through the first wall 102 is partially absorbed by the absorption layer. The substrate is made from conductive and transparent materials, such as ITO glass or IZO glass. The absorption layer is made from metal, such as aluminum, chromium or silver and so on. The dielectric layer is made from silicon oxide, silicon nitrite or metal oxide. Metal oxide can be obtained by directly oxidizing a portion of the absorption layer. The second wall 104 is a deformable reflective electrode. It shifts up and down by applying a voltage. The second wall 104 is typically made from dielectric materials/conductive transparent materials, or metal/conductive transparent materials.

FIG. 2 depicts a cross-sectional view of a display unit in the prior art after applying a voltage. As shown in FIG. 2, while driven by the voltage, the wall 104 is deformed and falls down towards the wall 102 due to the attraction of static electricity. At this time, the distance between wall 102 and 104, that is, the length of the cavity 108 is not exactly zero, but is d, which can be zero. If we use d instead of D in formula 1.1, only the visible light with a wavelength satisfying formula 1.1, which is $\lambda_2$, can generate a constructive interference, and be reflected by the wall 104, and pass through the wall 102. Because wall 102 has a high light absorption rate for light with wavelength $\lambda_2$, all the incident light in the visible light spectrum is filtered out and an observer who follows the direction of the incident light cannot observe any reflected light in the visible light spectrum. The display unit 100 is now "closed".

Refer to FIG. 1 again, which shows that the posts 106 of the display unit 100 are generally made from negative photoresist materials. Refer to FIGS. 3A to 3C, which depict a method for manufacturing a display unit in the prior art. Referring to FIG. 3A, the first wall 102 and a sacrificial layer 110 are formed in order on a transparent substrate 109, and then an opening 112 is formed in the wall 102 and the sacrificial layer 110. The opening 112 is suitable for forming posts therein. Next, a negative photoresist layer 111 is spin-coated on the sacrificial layer 110 and fills the opening 112. The objective of forming the negative photoresist layer 111 is to form posts between the first wall 102 and the second wall (not shown). A backside exposure process is performed on the negative photoresist layer 111 in the opening 112, in the direction indicated by arrow 113 to the transparent substrate 109. The sacrificial layer 110 must be made from opaque materials, typically metal materials, to meet the needs of the backside exposure process.

Refer to FIG. 3B, which shows that posts 106 remain in the opening 112 after removing the unexposed negative photoresist layer. Then, the wall 104 is formed on the sacrificial layer 110 and posts 106. Referring to FIG. 3C, the sacrificial layer 110 is removed by a release etching process to form a cavity 114. The length D of the cavity 114 is the thickness of the sacrificial layer 110. Therefore, different thicknesses of the sacrificial layers must be used in different processes of the different display units to control reflection of light with different wavelengths.

An array comprising the display unit 100 controlled by voltage operation is sufficient for a single color planar display, but not for a color planar display. A method in the prior art is to manufacture a pixel that comprises three display units with different cavity lengths as shown in FIG. 4, which depicts a cross-sectional view of a matrix color planar display in the prior art. Three display units 302, 304 and 306 are formed as an array on a substrate 300, respectively. Display units 302, 304 and 306 can reflect an incident light 308 to color lights with different wavelengths, for example, which are red, green and blue lights, due to the different lengths of the cavities of the display units 302, 304 and 306. It is not required that different reflective mirrors be used for the display units arranged in the array. More important is that good resolution be provided and the brightness of all color lights is uniform. However, three display units with different lengths of cavities need to be manufactured separately.

Please refer to FIGS. 5A to 5D, which depict cross-sectional views of a method for manufacturing the matrix color planar display in the prior art. In FIG. 5A, the first wall 310 and the first sacrificial layer 312 are formed in order on a transparent substrate 300, and then openings 314, 316, 318, and 320 are formed in the first wall 310 and the sacrificial layer 312 for defining predetermined positions where display units 302, 304, and 306 are formed. The second sacrificial layer 322 is then conformally formed on the first sacrificial layer 312 and in the openings 314, 316, 318, and 320.

Please referring to FIG. 5B, after the second sacrificial layer 322 in and between the openings 314 and 316, and in the openings 318 and 320 is removed by a photolithographic etch process, the third sacrificial layer 324 is conformally formed on the first sacrificial layer 312 and the second sacrificial layer 322 and in the openings 314, 316, 318 and 320.

Please refer to FIG. 5C, which shows that the third sacrificial layer 324 in the openings 318 and 320 remains but the remainder of the third sacrificial layer 324 is removed by a photolithographic etch process. Next, a negative photoresist is spin-coated on the first sacrificial layer 312, the second sacrificial layer 322, and the third sacrificial layer 324, and in the openings 314, 316, 318 and 320, and fills the all openings to form a negative photoresist layer 326. The negative photoresist layer 326 is used for forming posts (not shown) between the first wall 310 and the second wall (not shown).

Please refer to FIG. 5D, which shows that a backside exposure process is performed on the negative photoresist layer 326 in the openings 314, 316, 318 and 320 in a direction of the transparent substrate 300. The sacrificial layer 110 must be made at least from opaque materials, typically metal materials, to meet the needs of the backside exposure process. Posts 328 remain in the openings 314, 316, 318 and 320 after removing the unexposed negative photoresist layer 326. Subsequently, the second wall 330 conformally covers the first sacrificial layer 312, the second sacrificial layer 322, the third sacrificial layer 324 and posts 328.

Afterward, the first sacrificial layer 312, the second sacrificial layer 322, and the third sacrificial layer 324 are removed by a release etching process to form the display units 302, 304, and 306 shown in FIG. 4, wherein the lengths d1, d2, and d3 of three display units 302, 304, and 306 are the thicknesses of the first sacrificial layer 312, the second sacrificial layer 322, and the third sacrificial layer 324, respectively. Therefore, different thicknesses of sacrificial layers must be used in different processes of the different display units, to achieve the objective for controlling reflection of different wavelengths of light.

There are at least three photolithographic etch processes required for manufacturing the matrix color planar display in the prior art, to define the lengths of the cavities of the display units 302, 304, and 306. In order to cooperate with the backside exposure for forming posts, metal materials must be used for making the sacrificial layer. The cost of the complicated manufacturing process is higher, and the yield cannot be increased due to the complicated manufacturing process.

Therefore, it is an important subject to provide a simple method of manufacturing an optical interference display unit structure, for manufacturing a color optical interference display with high resolution, high brightness, simple process and high yield.

SUMMARY OF THE INVENTION

It is therefore an objective of the present invention to provide a method for manufacturing an optical interference display unit structure, and the method is suitable for manufacturing a color optical interference display with resolution and high brightness.

It is another an objective of the present invention to provide a method for manufacturing an optical interference display unit structure, and the method is suitable for manufacturing a color optical interference display with a simple and easy manufacturing process and high yield.

It is still another objective of the present invention to provide a method for manufacturing an optical interference display unit structure, and the method is suitable for manufacturing a color optical interference display with posts.

In accordance with the foregoing objectives of the present invention, one preferred embodiment of the invention provides a method for manufacturing an optical interference display unit structure. The optical interference display unit structure has a first electrode and a second electrode. Posts are located between the two electrodes and support the electrodes. The feature of the present invention is that the thickness of the second electrode is convertible. Therefore, the stress of the second electrode with different thickness is different. After a thermal process, the second electrode may generate displacement by stress action. The distance between two electrodes may alters because the different displacement of the second electrode. The method of fabricating the optical interference display unit structure is also disclosed in the same embodiment.

The first wall and a sacrificial layer are formed in order on a transparent substrate, and then openings are formed in the first wall and the sacrificial layer. The openings are suitable for forming posts therein. Next, a photoresist layer is spin-coated on the sacrificial layer and fills the opening. A photolithographic process patterns the photoresist layer to define a post. The post could comprise a support and an arm, the support is formed in one opening and the arm is formed on the top of the support and on the sacrificial layer. The support and the arm are used for a post.

One or multi conductive layer are formed on the sacrificial layer and posts, and the conductive layer(s) is/are used as the second wall. The dielectric layer also can be used to alter the thickness or the stress of the second wall. Then, a thermal process, such as a backing process is performed on the structures. The second wall may generate different displacement by stress action because the different stress of the second wall and the distance between two walls is different. If the post has an arm, the total stress of the arm and the second wall decides the distance between the two walls. Afterward, the sacrificial layer is removed by a release etching process to form a cavity, and the length D of the cavity may not be equal to the thickness of the sacrificial layer due to the displacement of the second wall.

Additionally, the arms of the post with the ratios of various length to thickness have various amounts of stress, and displacements and directions generated by arms are various during baking. Therefore, the arms with the ratios of various lengths to thickness and the thickness of the second wall may be used for controlling the length of the cavity, instead of the various thickness of the sacrificial layers used in the various processes of the display units to control various wavelengths of light reflected in the prior art. There are many advantages in the above way. First of all, the cost drops drastically. The thickness of the cavity in the prior art is the thickness of the sacrificial layer, and the sacrificial layer needs to be removed at the end of the process. However, using an upward displacement of the second wall in the present invention increases the length of the cavity, so that the length of the cavity is greater than the thickness of the sacrificial layer, even if the thickness of the sacrificial layer is substantially decreased while forming the same length of cavities. Therefore, the material used for manufacturing the sacrificial layer is substantially reduced. The second, the process time is shortened. The release etching process of the metal sacrificial layer in the prior art consumes lots of time, because the sacrificial layer is removed by an etching gas that must permeate the spaces between the posts. The present invention utilizes a mask for a front exposure, so the sacrificial layer can be transparent materials such as dielectric materials, instead of opaque materials such as metal and the like as in the prior art. Besides, the thickness used by the sacrificial layer can be substantially reduced, so the time required for the release etching process can be also drastically decreased. Third, the color optical interference display formed by using posts can substantially reduce complexity of the process. The difference in the ratios of thickness of the second wall is used for changing the stress of the second wall. After baking, various optical interference display units have various lengths of the cavities due to the displacement of the second wall, such that reflected light is changed with various wavelengths, such as red, green, and blue lights, so as to obtain various color lights.

In accordance with another an objective of the present invention, one preferred embodiment of the invention provides a method for manufacturing a matrix color planar display structure. Each matrix color planar display unit has three optical interference display units. The first wall and a sacrificial layer are formed in order on a transparent substrate, and then an opening is formed in the first wall and the sacrificial layer. The opening is suitable for forming posts therein. Next, a photoresist layer is spin-coated on the sacrificial layer and fills the opening. A photolithographic process patterns the photoresist layer to define a support with an arm. The support and the arm are used for a post, and to define the length of the arm. Afterward, a first electrode layer is formed on the three optical interference display unit and a second electrode layer is formed on the first electrode layer which is on the second and the third optical interference display units. Thereafter, a third electrode layer is formed on the second electrode layer which is on the third optical interference display unit. The first electrode layer is the second wall of the first optical interference display unit, the first electrode layer and the second electrode layer are the second wall of the second optical interference display unit, and the first electrode layer, the second electrode layer and the third electrode layer are the second wall of the third optical interference display unit. Therefore, the thickness of the second wall of the three optical interference display unit is different and the stress of the second wall on the three optical interference display unit is different, too. In this embodiment, due to the exposure of the photoresist layer with the help of a mask, the sacrificial layer no longer must be an opaque material such as metal and the like; common dielectric materials are also used for making the sacrificial layer.

The second wall is formed on the sacrificial layer and posts, and then baking is performed on the posts. The second wall may generate displacement by stress action. The displacements of the second walls of the different optical interference display unit are different because the thickness of the second wall of the different optical interference display unit is different. Afterward, the sacrificial layer are removed by a release etching process to form a cavity, and the length D of the cavity may not be equal to the thickness of the sacrificial layer due to the displacement of the arm.

The first wall is the first electrode, and the second wall is the second electrode. The thickness of the second wall of the different optical interference display unit is different, however, the stress of the second wall of the different optical interference display unit is also different. Therefore, the displacement of the second electrodes is different after a baking process. The distance between the two electrodes, i.e. the length of the cavity, of the different optical interference display unit is different. Therefore, after baking, each optical interference display unit has various cavity lengths, such that reflected light is changed with different wavelengths, such as red, green, and blue light. These in turn provide various color lights for a matrix color planar display structure.

In accordance with the color planar display consisting of an array of optical interference display units disclosed by the present invention, the advantages of a matrix color planar display according to the prior art are retained, including high resolution and high brightness, as well as the advantages of a multi-layered color planar display with a simple process and high yield in the prior art. It is understood that the present invention discloses an optical interference display unit which not only keeps all advantages of the prior optical interference color planar display such as high resolution, high brightness, simple process and high yield during forming arrays, but also increases the window during processing and raises the yield of the optical interference color planar display.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will be more fully understood by reading the following detailed description of the preferred embodiment, with reference made to the accompanying drawings as follows.

DETAILED DESCRIPTION OF THE PREFERRED EMBODIMENT

Figure 1:
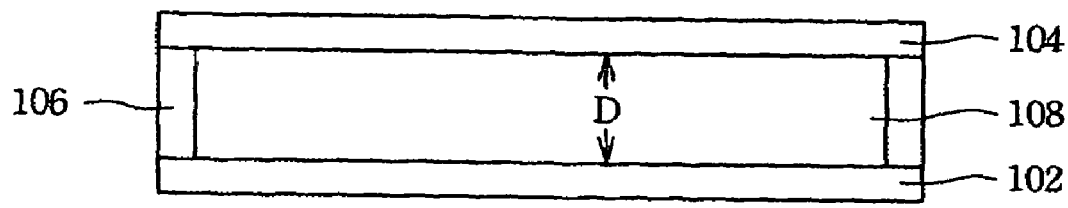
FIG. 1 depicts a cross-sectional view of a display unit in the prior art.
Figure 2:
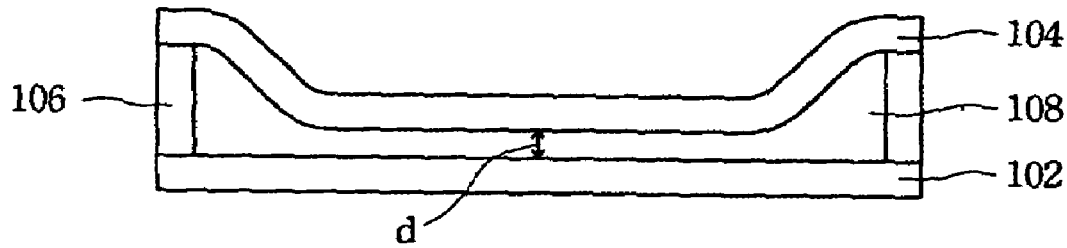
FIG. 2 depicts a cross-sectional view of a display unit in the prior art after applying a voltage.
Figure 3A:
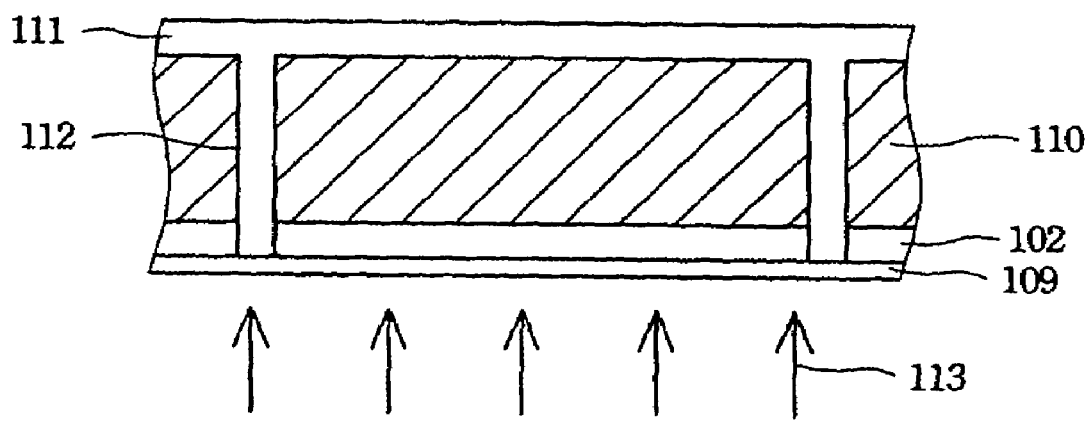
FIGS. 3A to 3C depict a method for manufacturing a display unit in the prior art.
Figure 3B:
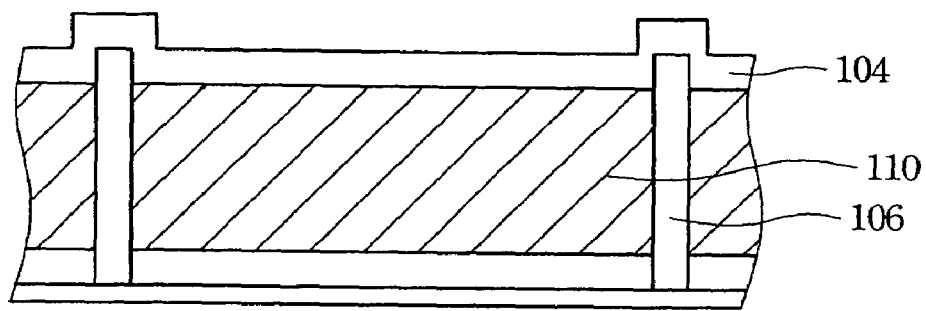
Figure 3C:
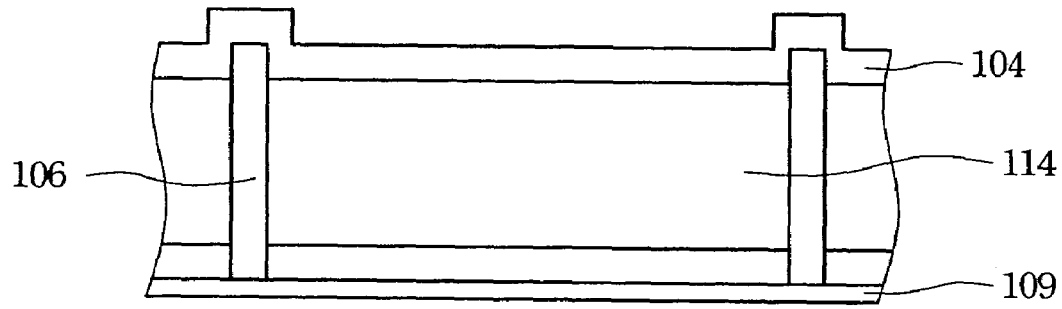
Figure 4:
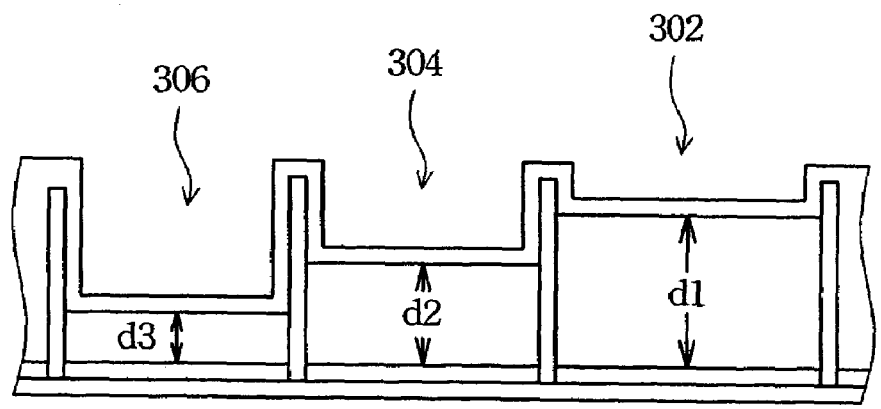
FIG. 4 depicts a cross-sectional view of a matrix color planar display in the prior art.
Figure 5A:
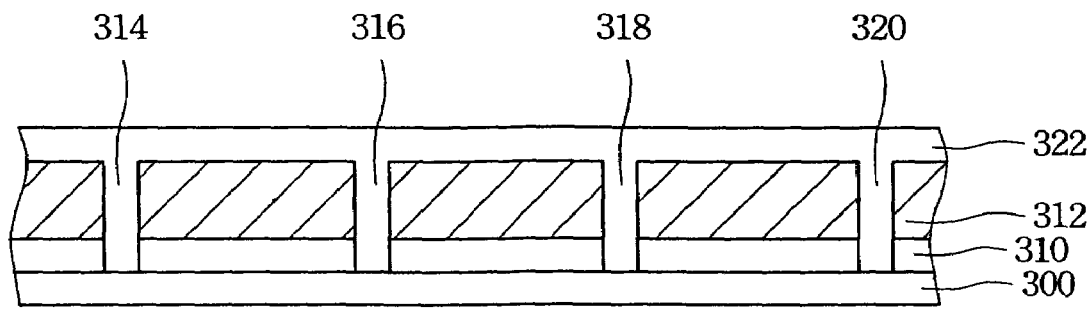
FIGS. 5A to 5D depict cross-sectional views of a method of manufacturing a matrix color planar display in the prior art.
Figure 5B:
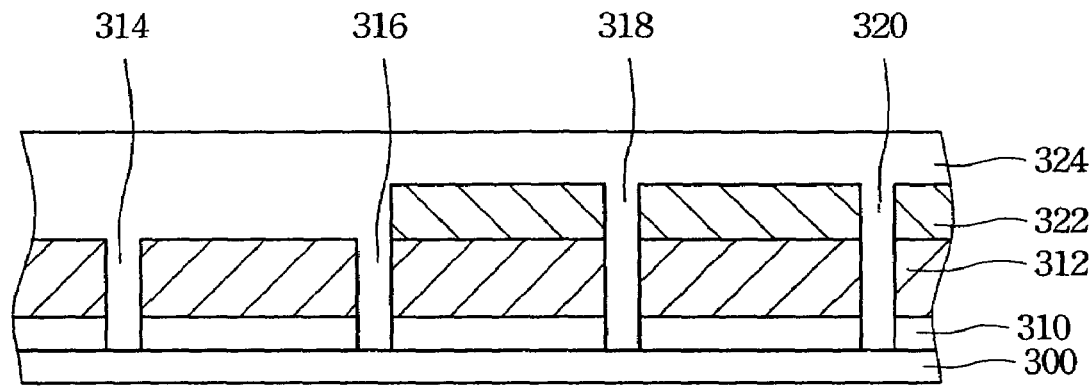
Figure 5C:
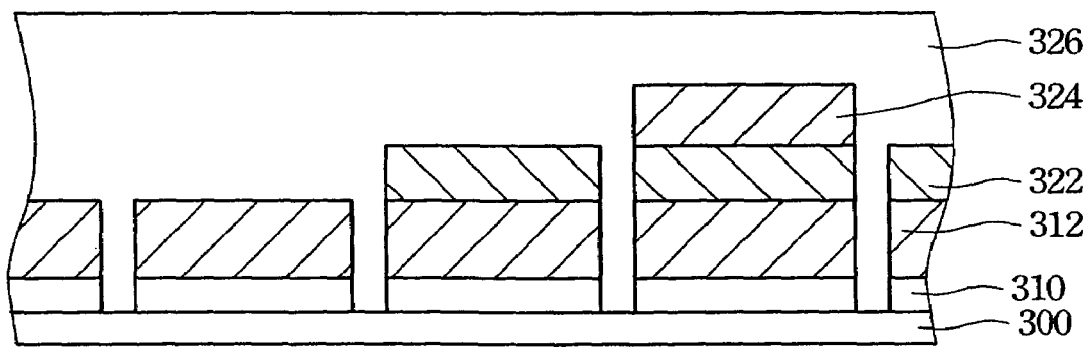
Figure 5D:
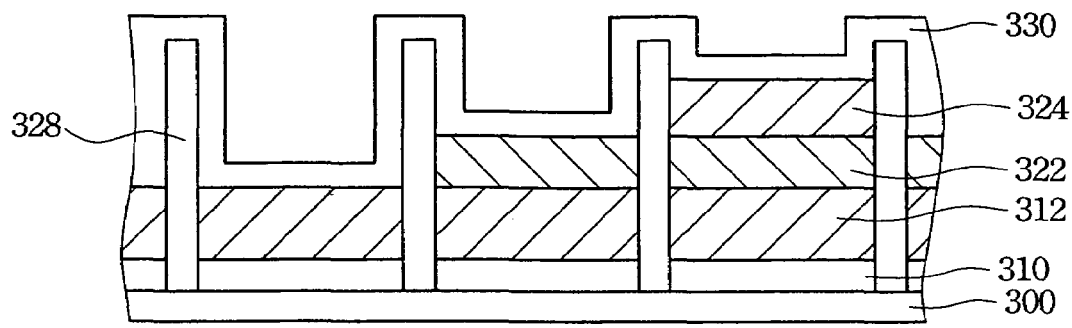

In order to provide more information of the optical interference display unit structure, the first embodiment is provided herein to explain the optical interference display unit structure in this invention. In addition, the second embodiment is provided to give further description of the optical interference color planar display formed with an array of the optical interference display unit.

Embodiment 1

FIGS. 6A to 6E depict a method for manufacturing an optical interference display unit according to a preferred embodiment of the invention. Please referring to FIG. 6A first, a first electrode 602 and a sacrificial layer 604 are formed in order on a transparent substrate 601. The sacrificial layer 604 is made of transparent materials such as dielectric materials, or opaque materials such as metal materials. Opening 606, 608, 610 and 612 are formed in the first electrode 602 and the sacrificial layer 604 by a photolithographic etching process. The openings 606, 608, 610 and 612 are suitable for forming a post therein.

Next, a material layer 614 is formed on the sacrificial layer 604 and fills the openings 606, 608, 610 and 612. Openings 606 and 608, openings 608 and 610, and openings 610 and 612 are used to define the location of the optical interference display units 630, 632 and 634. The material layer 614 is suitable for forming posts, and the material layer 614 generally uses photosensitive materials such as photoresists, or non-photosensitive polymer materials such as polyester, polyamide or the like. If non-photosensitive materials are used for forming the material layer 614, a photolithographic etch process is required to define posts in the material layer 614. In this embodiment, the photosensitive materials are used for forming the material layer 614, so merely a photolithographic etching process is required for patterning the material layer 614.

Figure 6A:
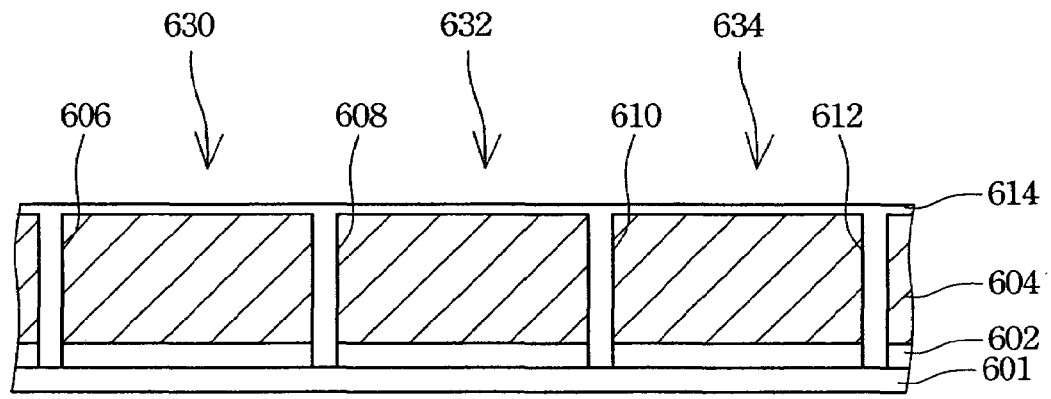
FIGS. 6A to 6E depict a method for manufacturing an optical interference display unit according to one preferred embodiment of this invention.
Figure 6B:
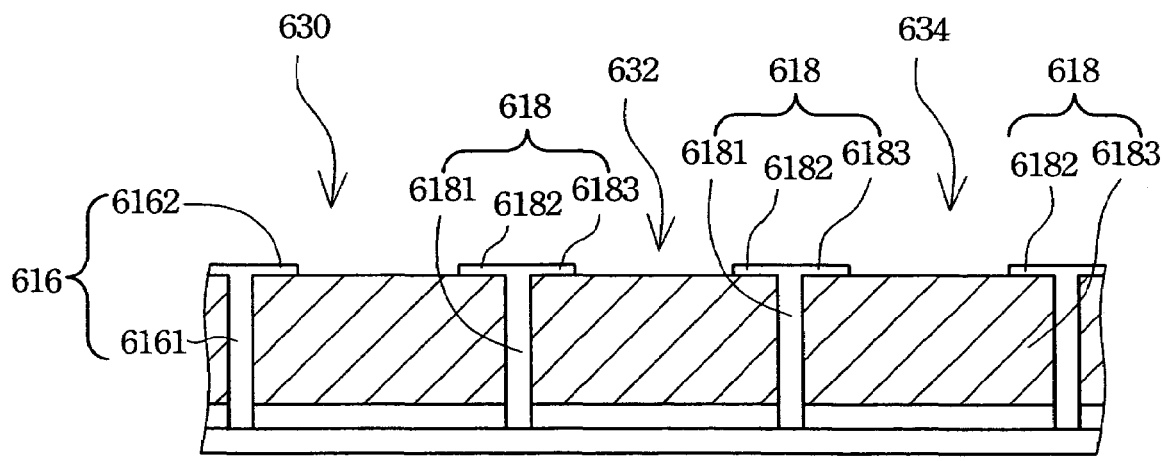

Referring to FIG. 6B, the posts 616, 618, 620 and 622 are defined by patterning the material layer 614 during a photolithographic process. The posts 616, 618, 620 and 622 have supports 6161, 6181, 6201 and 6221 disposed in the openings 606, 608, 610 and 612, and the posts 616, 618, 620 and 622 have arms 6162, 6182, 6183, 6202, 6203 and 6222. The length of arms 6162, 6182, 6183, 6202, 6203 and 6222 is same. Therefore, the area of the optical interference display units 630, 632 and 634 for reflecting incident light is similar.

Figure 6C:
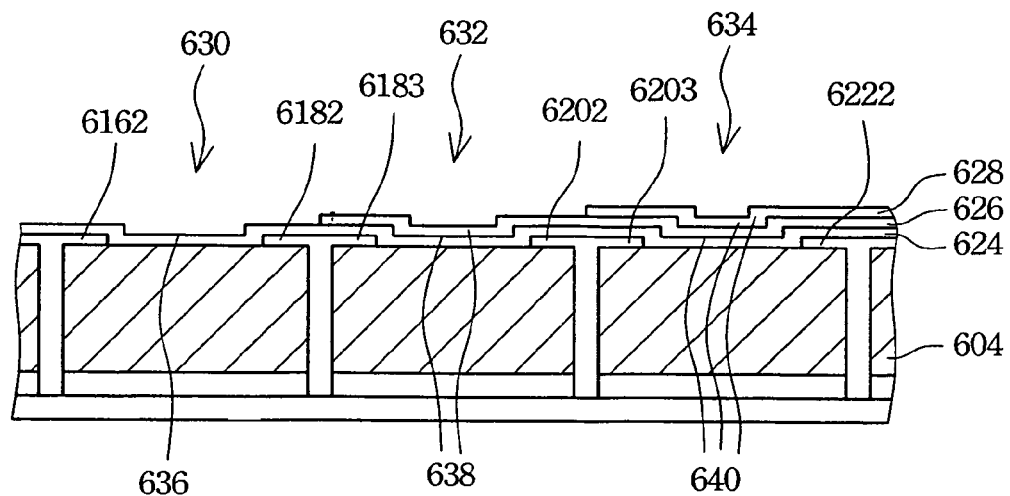

Reference is next made to FIG. 6C. A first electrode layer 624 is formed on the sacrificial layer 604 and the arms 6122, 6182, 6183, 6202, 6203 and 6222. Next, a second electrode layer 626 is formed on the first electrode layer 624, which is located on the optical interference display units 632 and 634. Then, a third electrode layer 628 is formed on the second electrode layer 626 which is located on the optical interference display unit 634. Reference is further made to FIG. 6C. The first electrode layer 624 on the optical interference display unit 630 is used as the second electrode 636 of the optical interference display unit 630, the first electrode layer 624 and the second electrode layer 626 on the optical interference display unit 632 are used as the second electrode 638 of the optical interference display unit 632, and the first electrode layer 624, the second electrode layer 626 and the third electrode layer 628 on the optical interference display unit 634 are used as the second electrode 640 of the optical interference display unit 634.

There are several fabricating processes to form the second electrode disclosed above. When the same material for forming the electrode layers is used, a deposition process is performed to form a enough thick electrode layer on the sacrificial layer and the posts and at least one photolithographic process and at least one time control etching process are adapted to form the second electrode with different thickness on the different optical interference display unit. When more than one material for forming the electrode layers are used, deposition processes are performed to form a enough thick electrode layers on the sacrificial layer and the posts and at least one photolithographic process and at least one selective etching process are adapted to form the second electrode with different thickness on the different optical interference display unit. The materials for forming the electrode layers could be conductive transparent material, metal, conductive opaque material, conductive hemitransparent material and dielectric material.

Figure 6D:
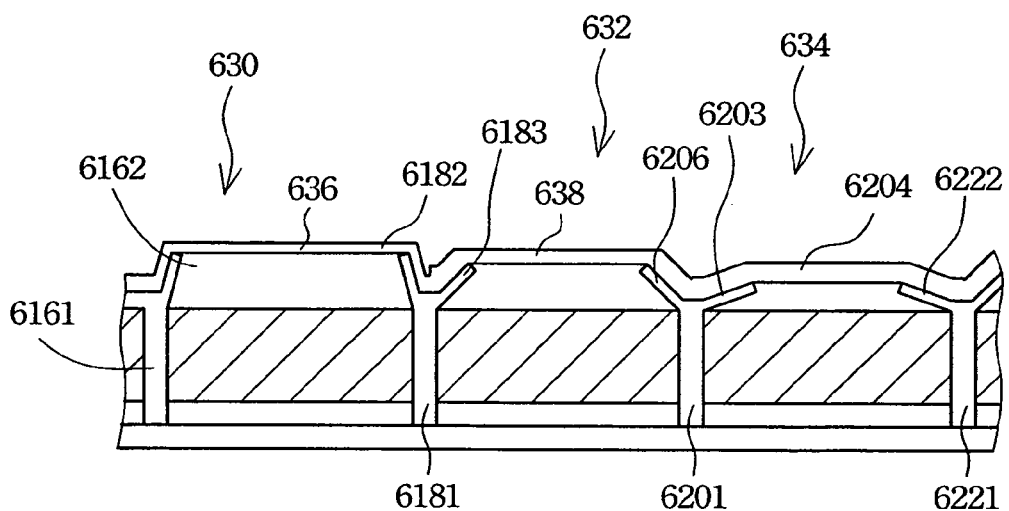

Referring is made to FIG. 6D, a thermal process is performed, such as baking. The second electrode 636, 638 and 640 of the optical interference display unit 630, 632 and 634 may generate displacement by a stress action. The arms 6162, 6182, 6183, 6202, 6203, and 6222 of the posts 616, 618, 620, and 622 may also generate displacement as the pivot of the supports 6161, 6181, 6201, and 6221 caused by stress action. There is less displacement at the ends of the arms 6162, 6182, 6183, 6202, 6203, and 6222 adjacent to the supports 6161, 6181, 6201, and 6221, but more displacement at the other ends of the arms 6162, 6182, 6183, 6202, 6203, and 6222. The arms 6162, 6182, 6183, 6202, 6203, and 6222 meet the second electrode 636, 638 and 640, which have different thickness and stress, therefore, there are various changes in the positions of the second electrode 630 caused by the arms 6162 and 6182, the arms 6183 and 6202, and the arms 6203 and 6222.

Figure 6E:
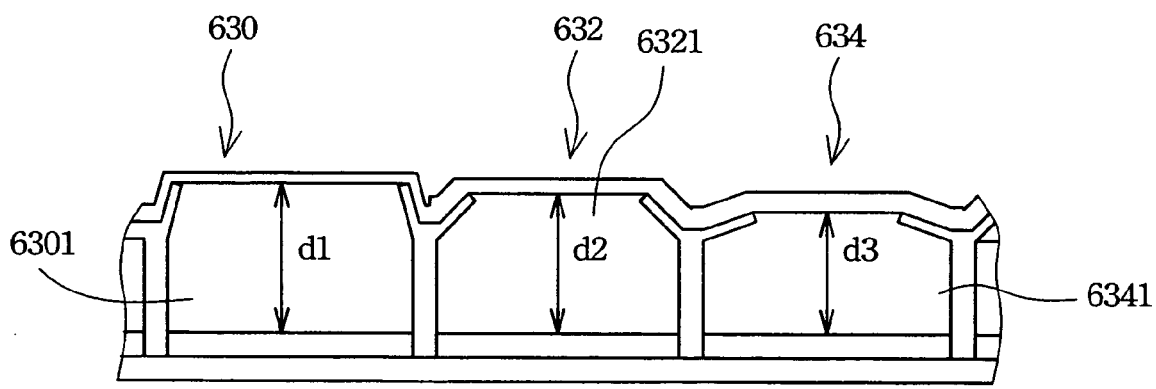

Thereafter, reference is made to FIG. 6E. The sacrificial layer 604 is removed by a release etching process to form the cavities 6301, 6321, and 6341 of the optical interference display units 630, 632, and 634. The cavities 6301, 6321, and 6341 have various lengths $d_1$, $d_2$, and $d_3$, respectively. When the optical interference display units 630, 632, and 634 are "open", as shown as the formula 1.1, the design of lengths $d_1$, $d_2$, and $d_3$ of the cavities 6301, 6321, and 6341 can generate the reflected light with different wavelengths, such as red (R), green (G), or blue (B) light.

The lengths $d_1$, $d_2$, and $d_3$ of the cavities 6301, 6321, and 6341 are not decided by the thickness of the sacrificial layer, but by the thickness of the second electrode 636, 638 and 640, respectively. Therefore, the complicated photolithographic process of the prior art to define various lengths of the cavities forming various thicknesses of the sacrificial layers is unnecessary.

The arms disclosed in the preferred embodiment are not necessary. Even in the case without the arms, the second electrode with different thickness may generate different displacement by a stress action after a thermal process.

In accordance with the color planar display consisting of the array of optical interference display units disclosed by this embodiment, the advantages of a matrix color planar display in the prior art are retained, including high resolution and high brightness, as well as the advantages of the prior art multi-layered color planar display such as simple process and high yield. Compared with the matrix color planar display in the prior art, the embodiment discloses an optical interference display unit that does not require the complicated photolithographic process in the prior art to define various lengths of the cavities by forming various thicknesses of the sacrificial layers. The optical interference display unit thus has a simple process and high yield. Compared with the matrix color planar display in the prior art, the embodiment discloses an array of optical interference display units, in which all the optical interference display units that can generate reflected color light are located in the same plane. In other words, the incident light can reflect various color lights without passing through the multi-layered optical interference display unit; thus, the optical interference display unit has high resolution and high brightness. Furthermore, in the multi-layered optical interference display in the prior art, in order to make an incident light to pass through a former display unit and reach a latter display unit efficiently, and the result of light interference in the latter display unit (reflected light of green or blue light wavelength) to pass through a former display unit efficiently, the compositions and thicknesses of the first electrode and the second electrode of three types of display units are different. The manufacturing process is actually more complicated than expected. The process for the array of the optical interference display units disclosed by this invention is less difficult than the process in the prior art.

Although the present invention has been described in considerable detail with reference certain preferred embodiments thereof, other embodiments are possible. Therefore, their spirit and scope of the appended claims should no be limited to the description of the preferred embodiments container herein. In view of the foregoing, it is intended that the present invention cover modifications and variations of this invention provided they fall within the scope of the following claims and their equivalents.

What is claimed is:

1. A method for manufacturing a matrix color optical interference display unit disposed on a substrate, the method comprising:

forming a first electrode on the substrate;

forming a sacrificial layer on the first electrode;

forming at least four openings in the sacrificial layer and the first electrode to define positions of a first optical interference display unit, a second optical interference display unit, and a third optical interference display unit;

forming a post comprising a support in each of the openings and at least an arm on the sacrificial layer;

forming at least one first electrode layer on the sacrificial layer, the arms and the posts, wherein the first electrode layer forms a second electrode of the first optical interference display unit;

forming at least one second electrode layer on the first electrode layer located only on the second optical interference display unit and the third optical interference display unit, wherein the first and the second electrode layers form a third electrode of the second optical interference display unit;

forming at least one third electrode layer on the second electrode layer located only on the third optical interference display unit, wherein the first, the second and the third electrode layers form a fourth electrode of the third optical interference display unit;

performing a thermal process to make the second, the third and the fourth electrodes able to generate displacement due to stress, thereby various distances between the first electrode and the second, the third and the fourth electrodes are formed; and removing the sacrificial layer.

2. The method for manufacturing a matrix color optical interference display unit of claim 1, wherein a material for forming the posts is selected from a group consisting of photosensitive materials, non-photosensitive materials and a combination thereof.

3. The method for manufacturing a matrix color optical interference display unit of claim 2, wherein the photosensitive materials are a photoresist.

4. The method for manufacturing a matrix color optical interference display unit of claim 1, wherein the step of forming the post further comprises:

forming a photosensitive material layer to fill the openings and cover the sacrificial layer; and patterning the photosensitive material layer to form the support in each of the openings and the arm on the support.

5. The method for manufacturing a matrix color optical interference display unit of claim 4, wherein the step of patterning the photosensitive material layer includes a photolithographic process.

6. The method for manufacturing a matrix color optical interference display unit of claim 1, wherein the step for forming the support and the arm further comprises:

forming a non-photosensitive material layer to fill the openings and cover the sacrificial layer; and patterning the non-photosensitive material layer to form the support in each of the openings and the arm on the support by a photolithographic etch process.

7. The method for manufacturing a matrix color optical interference display unit of claim 1, wherein the thermal process is baking.

8. The method for manufacturing a matrix color optical interference display unit of claim 1, wherein the second, the third and the fourth electrodes are deformable electrodes.

9. The method for manufacturing a matrix color optical interference display unit of claim 1, wherein the second, the third and the fourth electrodes are movable electrodes.

10. The method for manufacturing a matrix color optical interference display unit of claim 1, wherein a material of the first electrode layer is a conductive transparent material, a metal, a conductive opaque material, or a conductive hemi-transparent material.

11. The method for manufacturing a matrix color optical interference display unit of claim 1, wherein a material of the second or third electrode layer is a conductive transparent material, a metal, a conductive opaque material, a conductive hemi-transparent material or a dielectric material.

* * * * *